United States Patent
Sung et al.

(10) Patent No.: US 8,440,560 B2
(45) Date of Patent: May 14, 2013

(54) METHOD FOR FABRICATING TUNGSTEN LINE AND METHOD FOR FABRICATING GATE OF SEMICONDUCTOR DEVICE USING THE SAME

(75) Inventors: Min-Gyu Sung, Ichon-shi (KR); Heung-Jae Cho, Ichon-shi (KR); Kwan-Yong Lim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 147 days.

(21) Appl. No.: 12/163,943

(22) Filed: Jun. 27, 2008

(65) Prior Publication Data

US 2009/0029539 A1    Jan. 29, 2009

(30) Foreign Application Priority Data

Jul. 2, 2007    (KR) .................. 10-2007-0066170

(51) Int. Cl.
   *H01L 21/28*    (2006.01)
   *H01L 21/44*    (2006.01)
(52) U.S. Cl.
   USPC .................. 438/592; 438/653; 257/E21.177; 257/E21.476
(58) Field of Classification Search .................. 438/592, 438/653; 257/E21.177, E21.476
   See application file for complete search history.

(56) References Cited

U.S. PATENT DOCUMENTS

| | | | |
|---|---|---|---|
| 6,197,702 B1 * | 3/2001 | Tanabe et al. .................. 438/773 |
| 6,984,575 B2 * | 1/2006 | Yamamoto .................... 438/585 |
| 2002/0011636 A1 * | 1/2002 | Hayashi et al. ................ 257/413 |
| 2005/0019992 A1 * | 1/2005 | Hong et al. .................... 438/149 |
| 2008/0081452 A1 * | 4/2008 | Kim et al. ...................... 438/592 |
| 2008/0160746 A1 * | 7/2008 | Lim et al. ....................... 438/592 |
| 2008/0268635 A1 * | 10/2008 | Yu et al. ......................... 438/655 |
| 2009/0045517 A1 * | 2/2009 | Sugiura et al. ................. 257/770 |

FOREIGN PATENT DOCUMENTS

| | | |
|---|---|---|
| CN | 1575517 | 2/2005 |
| CN | 1647264 | 7/2005 |
| JP | 04-072733 | 3/1992 |
| JP | 2000-319774 | 11/2000 |
| KR | 1020010002668 A | 1/2001 |
| KR | 1020010004995 A | 1/2001 |
| KR | 2001-0059615 * | 7/2001 |
| KR | 1020010059615 | 7/2001 |
| KR | 2002016312 A * | 3/2002 |
| KR | 2003-0050652 * | 6/2003 |
| KR | 1020030050652 | 6/2003 |
| KR | 1020050023043 A | 3/2005 |
| KR | 714039 * | 5/2007 |

* cited by examiner

*Primary Examiner* — Hsien Ming Lee
*Assistant Examiner* — Walter H Swanson
(74) *Attorney, Agent, or Firm* — Kilpatrick Townsend & Stockton LLP

(57) ABSTRACT

A method for fabricating a tungsten (W) line includes forming a silicon-containing layer, forming a diffusion barrier layer over the silicon-containing layer, forming a tungsten layer over the diffusion barrier layer, and performing a thermal treatment process on the tungsten layer to increase a grain size of the tungsten layer.

24 Claims, 11 Drawing Sheets

BEFORE THERMAL TREATMENT     AFTER THERMAL TREATMENT

METHOD FOR FABRICATING TUNGSTEN LINE AND METHOD FOR FABRICATING GATE OF SEMICONDUCTOR DEVICE USING THE SAME

CROSS-REFERENCE TO RELATED APPLICATIONS

The present invention claims priority of Korean patent application number 2007-0066170, filed on Jul. 2, 2007, which is incorporated by reference in its entirety.

BACKGROUND OF THE INVENTION

The present invention relates to a method for fabricating a semiconductor device, and more particularly, to a method for fabricating a tungsten (W) line including a diffusion barrier layer.

As a linewidth of a dynamic random access memory (DRAM) device (e.g., a linewidth of a gate constituting a transistor) decreases under 100 nm, a sheet resistance (Rs) rapidly increases and a high-speed operation characteristic of the device is deteriorated due to a resistance-capacitance (RC) delay.

Figure 1A:
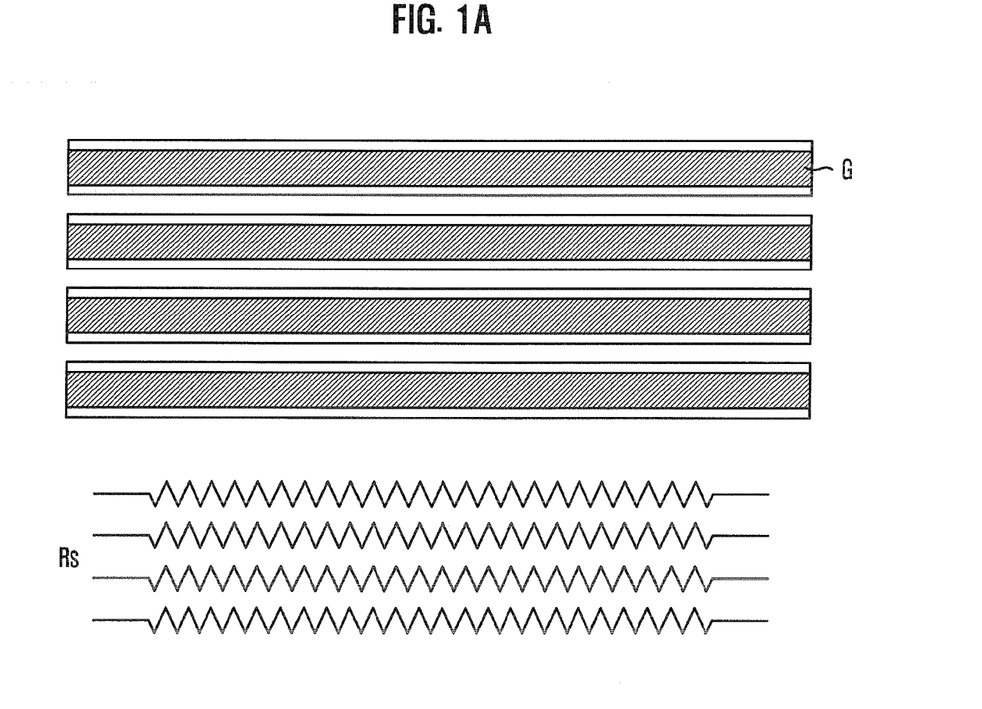
FIG. 1A is a top view of a gate structure constituting a wordline in a DRAM device.
Figure 1B:
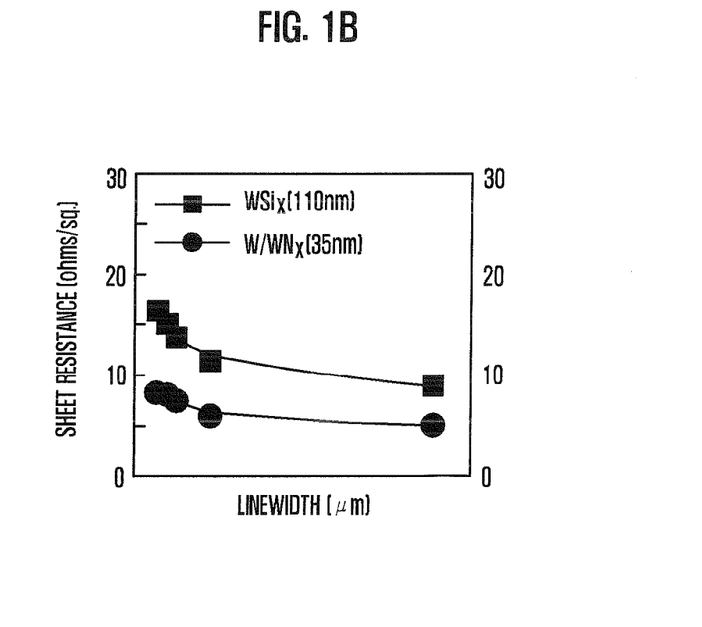
FIG. 1B illustrates variation of sheet resistance Rs according to a linewidth.

FIG. 1A is a top view of a gate structure constituting a wordline in a DRAM device. FIG. 1B illustrates variation of sheet resistance Rs according to a linewidth.

In the DRAM device, a bias is applied by connecting line-shaped gates to a number of memory cell regions formed by a shallow trench isolation (STI) process. Referring to FIG. 1A, a sheet resistance Rs change from a change in linewidth of a gate G is a parasitic resistance in a serial form.

Referring to FIG. 1B, the Rs of the gate G functioning as a parasitic resistance rapidly increases as the linewidth of the gate G decreases. When the gate G includes tungsten silicide ($WSi_x$), the Rs is higher and increases more rapidly as the linewidth of the gate G decreases.

As shown in FIG. 1B, when the gate G includes a tungsten (W), e.g., a tungsten nitride (WNX) layer, having a low resistivity than the tungsten silicide (WSiX) layer, the Rs may effectively decrease.

Recently, in memory devices having a linewidth under 0.1 µm, it is essential to use a W layer to form electrodes of a gate, a bit line and a metal line. A line structure using the W layer as an electrode is called a W line.

When the W line includes a polysilicon layer, it is required to form a diffusion barrier layer between the W layer and the polysilicon layer. This is to prevent an abnormal silicidation from occurring between the W layer and the polysilicon layer in a subsequent thermal treatment.

Figure 2A:
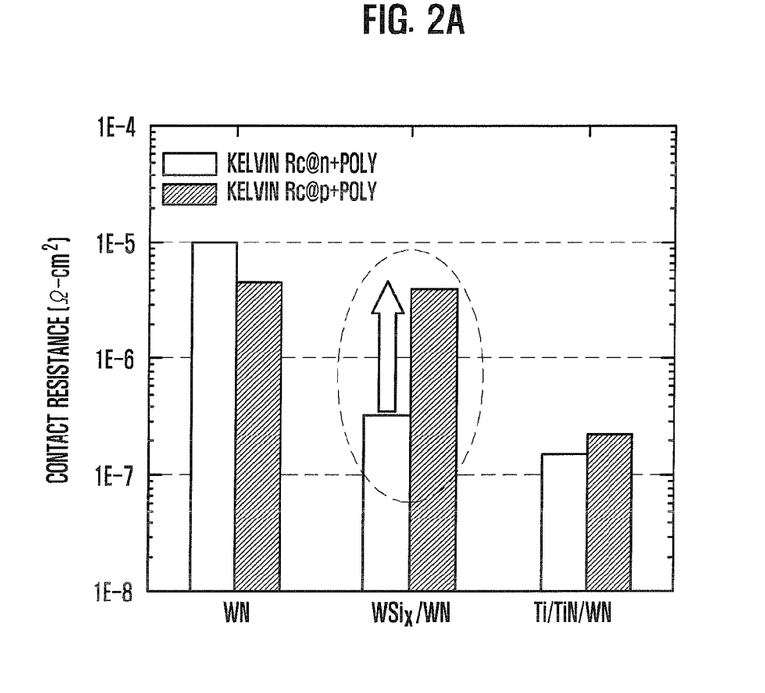
FIG. 2A illustrates contact resistances of a W layer changed according to the kinds of the diffusion barrier layers.

FIG. 2A illustrates contact resistances of a W layer changed according to the kinds of the diffusion barrier layers. Referring to FIG. 2A, the W line includes a polysilicon layer and a W layer. The polysilicon layer may include N-type impurities ($N^+$ poly) or P-type impurities ($P^+$ poly). The diffusion barrier layer may include one of a WN layer, a stack structure of $WSi_x$/WN layers, and a stack structure of titanium (Ti)/titanium nitride (TiN)/WN layers. The contact resistance means an interfacial resistance between the W layer and the polysilicon layer.

The W line including the WN layer as the diffusion barrier layer has a high contact resistance due to an insulative silicon (Si)—N reaction occurring at an interface of the WN layer and the polysilicon layer. In this case, the contact resistance is always high regardless of the kind of impurities doped into the polysilicon layer.

The W line including the stack structure of the $WSi_x$/WN layers has differing contact resistance depending on a type of impurities doped into the polysilicon layer. When the polysilicon layer is doped with P-type impurities, the contact resistance increases up to that of the W line including the WN layer. This is due to an insulative boron (B)—N reaction occurring at the interface of the polysilicon layer and the diffusion barrier layer. On the other hand, when the polysilicon layer is doped with N-type impurities, the contact resistance decreases.

When the W line includes the stack structure of the Ti/TiN/WN layers as the diffusion barrier layer, the contact resistance may be significantly lowered than the other diffusion barrier layers, regardless of the kind of the impurities doped into the polysilicon layer. This result is obtained because an insulative reaction does not occur at the interface of the polysilicon layer and the diffusion barrier layer.

Figure 2B:
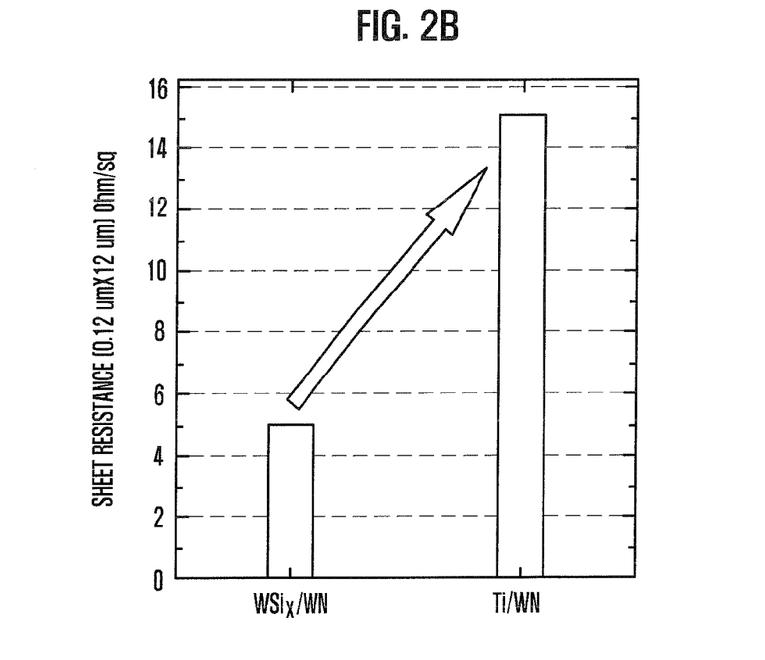
FIG. 2B is a diagram showing sheet resistance of the W layer changed according to kinds of diffusion barrier layers.

FIG. 2B is a diagram showing sheet resistance of the W layer changed according to kinds of diffusion barrier layers.

In a W line including a stack structure of $WSi_x$/WN layers, the WN layer deposited on the amorphous $WSi_x$ layer is amorphous. Accordingly, a W layer deposited on the WN layer has a large grain size and the W layer has a low sheet resistance.

On the other hand, in a W line including a stack structure of Ti/WN layers, the WN layer deposited on the crystalloid Ti layer has a crystalloid structure. Accordingly, in this case, the W layer deposited on the WN layer has a small grain size. As a result, the W layer has a high sheet resistance.

In a W line including a stack structure of TiN/WN layers, the W layer has a high sheet resistance due to the TiN layer deposited in the crystalloid form.

Table 1 shows the contact resistance and the sheet resistance according to the kind of diffusion barrier layers.

In Table 1, NMOS Rc represents a gate contact resistance of an NMOS transistor including a polysilicon layer doped with N-type impurities. PMOS Rc represents a gate contact resistance of a PMOS transistor including a polysilicon layer doped with P-type impurities. The NMOS Rc and the PMOS Rc show contact resistances when employing a process for forming a W dual gate.

TABLE 1

|  | WN | $WSi_x$/WN | Ti/(TiN)/WN |
| --- | --- | --- | --- |
| NMOS Rc | High | Low | Low |
| PMOS Rc | High | High | Low |
| Rs | Low | Low | High |

According to Table 1, there is no diffusion barrier layer which can obtain both low RS and low Rc (NMOS and PMOS).

SUMMARY OF THE INVENTION

Embodiments of the present invention relate to a method for fabricating a tungsten line which includes a diffusion barrier layer and a tungsten layer and can reduce both a contact resistance and a sheet resistance of the tungsten layer.

The present invention also relates to a method for fabricating a gate of a semiconductor device, which can reduce both a contact resistance and a sheet resistance of the gate.

In accordance with a first aspect of the present invention, there is provided a method for fabricating a tungsten (W) line. The method includes forming a silicon-containing layer, forming a diffusion barrier layer over the silicon-containing layer, forming a tungsten layer over the diffusion barrier layer, and performing a thermal treatment process on the tungsten layer to increase a grain size of the tungsten layer.

In accordance with a second aspect of the present invention, there is provided a method for fabricating a gate of a semiconductor gate. The method includes forming a gate insulation layer over a substrate, forming a silicon-containing layer over the gate insulation layer, forming a diffusion barrier layer over the silicon-containing layer, forming a tungsten layer over the diffusion barrier layer, and performing a thermal treatment process on the tungsten layer to increase a grain size of the tungsten layer.

DESCRIPTION OF SPECIFIC EMBODIMENTS

Embodiments of the present invention relate to a method for fabricating a semiconductor device, and more particularly, to a method for fabricating a tungsten line including a diffusion barrier layer.

Following embodiments provide methods for improving an RC delay increase in a memory device with linewidths under 100 nm. Where the increase is caused by the increase of a sheet resistance of a tungsten layer that employs a Ti-containing diffusion barrier layer including a stack structure of titanium (Ti)/tungsten nitride (WN) layers, TiN/WN layers or Ti/TiN/WN layers. After depositing the W layer, a thermal treatment process is performed in a hydrogen ($H_2$) atmosphere to reduce the sheet resistance of the W layer by increasing a grain size of the W layer.

Figure 3A:
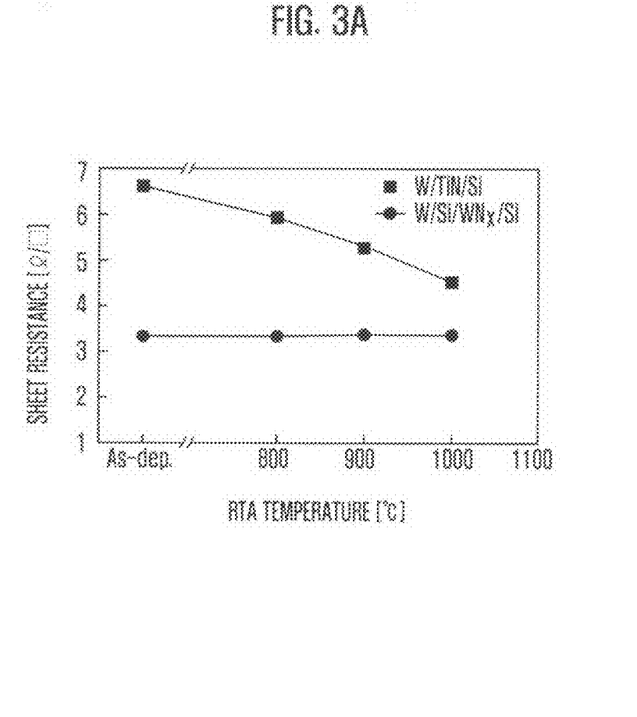
FIG. 3A is a graph showing sheet resistances measured according to variation of a temperature in a thermal treatment process performed on a W line including a W layer.

FIG. 3A is a graph showing sheet resistances measured according to variation of a temperature in a thermal treatment process performed on a W line including a W layer.

In the graph, an X-axis shows the various temperatures for the thermal treatment and a Y-axis describes the measured sheet resistance. In this experiment, a rapid thermal treatment process was performed. A first sample including Si, TiN and W layers and a second sample including Si, WNx, and W layers were used as the W line.

Referring to FIG. 3A, the first sample has the highest Rs in a deposited state. The Rs of the first sample decreases as the temperature for the thermal treatment increases.

The first sample including the Ti-containing layer as a diffusion barrier layer has a decreasing sheet resistance as the temperature for the thermal treatment increases. This is because the grain size of the W layer is increased by the thermal treatment.

Figure 3B:
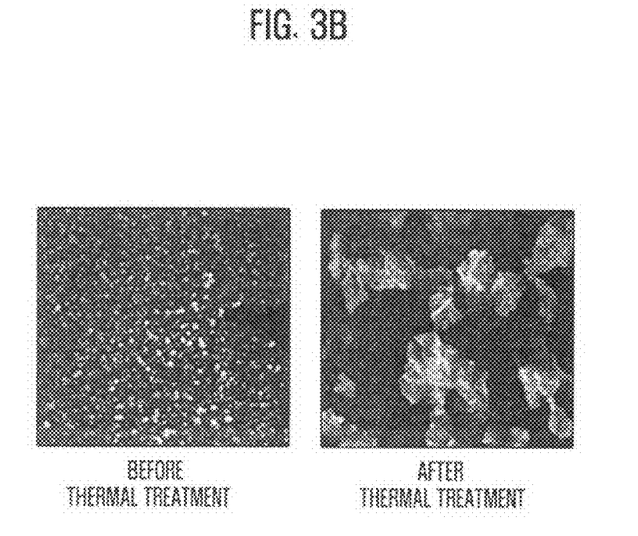
FIG. 3B provides images showing the tungsten layer before and after the thermal treatment process.

FIG. 3B provides images showing the tungsten layer before and after the thermal treatment process. It is noted that the grain size of the W layer after the thermal treatment is substantially increased compared to that before the thermal treatment.

Referring to FIGS. 3A and 3B, the W line including the W layer has a reduced sheet resistance by performing the thermal treatment process after depositing the W layer. Particularly, as the temperature for the thermal treatment becomes higher, the sheet resistance of the W layer further decreases.

Following embodiments provide methods for reducing both the contact resistance and the sheet resistance to achieve a high-speed operation of a semiconductor device. As can be seen from Table 1, the contact resistance when using the Ti-containing diffusion barrier layer further decreases compared to when other material-containing diffusion barrier layers are used.

That is, by using the Ti-containing diffusion barrier layer and performing the thermal treatment process after depositing the W layer, it is possible to obtain a W line having a low contact resistance and a low sheet resistance as a Ti-containing material for the diffusion barrier layer has a crystal-like structure or a crystalline structure regardless of the kind of deposition methods.

Figure 4A:
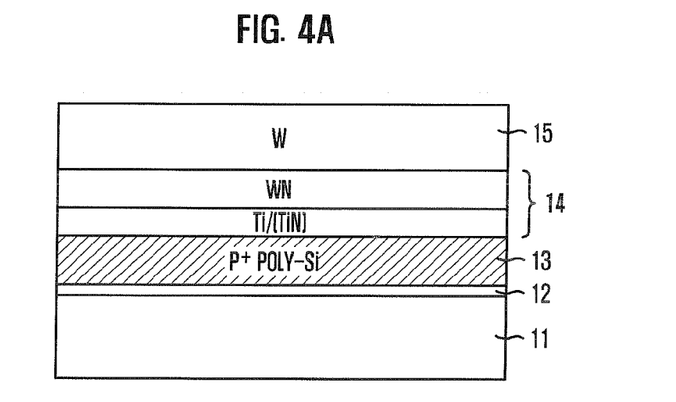
FIGS. 4A to 4C are cross-sectional views illustrating a method for fabricating a W line in accordance with a first embodiment of the present invention. The W line has a gate structure of, e.g., a PMOS transistor.
Figure 4B:
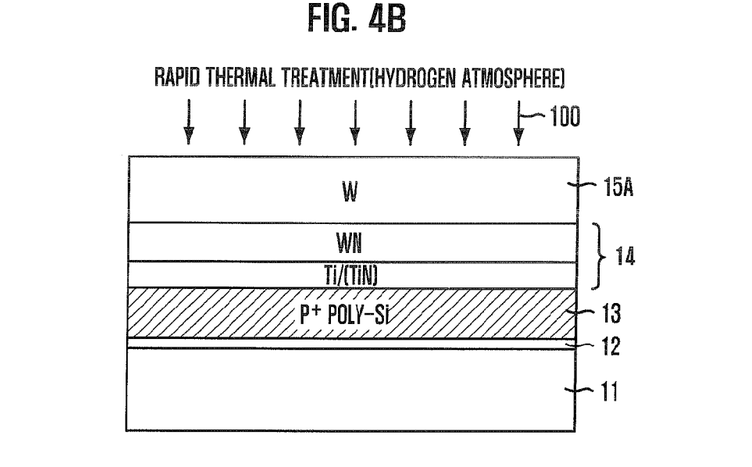
Figure 4C:
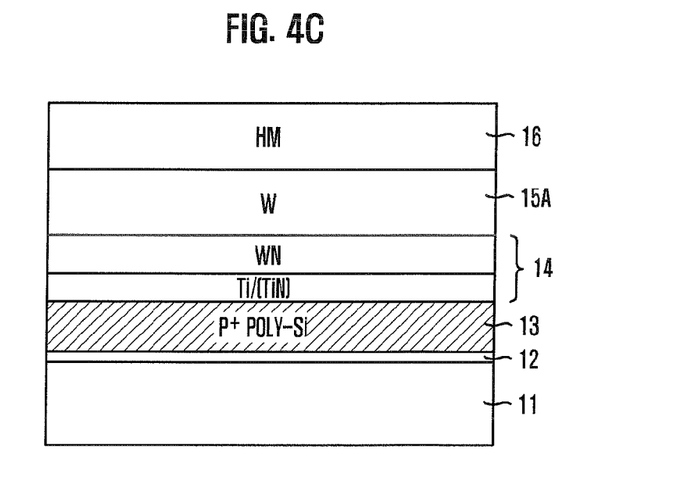

FIGS. 4A to 4C are cross-sectional views illustrating a method for fabricating a W line in accordance with a first embodiment of the present invention. The W line has a gate structure of, e.g., a PMOS transistor. The W line has a gate structure of, for example, a PMOS transistor.

Referring to FIG. 4A, a gate insulation layer 12 is formed over a substrate 11. The gate insulation layer 12 may be a silicon oxide layer ($SiO_2$) or a silicon oxy-nitride (SiON) layer.

A silicon-containing layer 13 is formed over the gate insulation layer 12. The silicon (Si)-containing layer 13 may include a polysilicon layer, for example, a polysilicon layer doped with impurities or a polysilicon layer doped with P-type conductive impurities (i.e., a $P^+$ polysilicon layer). The P-type conductive impurities may include boron (B).

A diffusion barrier layer 14 is formed over the Si-containing layer 13. The diffusion barrier layer 14 may include a Ti-containing material, for example, the diffusion barrier layer 14 may be a double layer of Ti/WN, a double layer of TiN/WN, or a triple layer of Ti/TiN/WN. The Ti layer, the TiN layer, and the WN layer are deposited using a physical vapor deposition (PVD) method. Particularly, since the Ti layer is deposited using the PVD method, it has a crystal-like structure. Thus, the TiN layer and the WN layer deposited on the crystalloid Ti layer also have crystal-like structures.

A W layer 15 is deposited on the diffusion barrier layer 14. The W layer 15 is deposited using the PVD method.

Since the diffusion barrier layer 14 includes the crystalloid Ti layer, the WN layer deposited on the Ti layer also has a crystal-like structure. Accordingly, the W layer 15 deposited on the WN layer has a small grain size.

Referring to FIG. 4B, after depositing the W layer 15, a thermal treatment process 100 is performed to increase the grain size of the W layer 15. The thermal treatment process 100 may be a rapid thermal treatment process and may be performed in a $H_2$ atmosphere.

The rapid thermal treatment has higher mass productivity than the other thermal treatments and reduces an attack on the material below the W layer 15 by performing the process in a short time. Performing the thermal treatment process in a furnace requires a longer time. Thus, it is difficult to prevent an attack by a thermal budget and the W layer 15 may be abnormally oxidized in the furnace.

The reason for performing the thermal treatment process in the $H_2$ atmosphere is to prevent the abnormal oxidation of the W layer 15. When other atmospheres other the $H_2$ atmosphere, e.g., ammonia ($NH_3$), oxygen ($O_2$) or nitrogen ($N_2$) atmospheres, are used for the thermal treatment process, the abnormal oxidation of the W layer 15 can be easily caused. Thus, the thermal treatment process can be performed in the atmosphere including $H_2$.

The temperature for the thermal treatment process ranges from approximately 800° C. to approximately 1,000° C., desirably, from approximately 800° C. to approximately 950° C. The thermal treatment process is performed for less than five minutes. When the temperature for the thermal treatment is higher than approximately 1,000° C., the abnormal oxidation of the W layer 15 may be caused. When the temperature for the thermal treatment process is lower than approximately 800° C., the grain size of the W layer 15 is not effectively increased.

As described, the grain size of the W layer 15 can be increased by the thermal treatment process 100. The sheet resistance of the W line in this case may be lowered compared to just depositing the W layer 15 without performing the thermal treatment. The W layer 15 having the increased grain size is called a W pattern 15A.

Referring to FIG. 4C, a gate hard mask layer 16 is deposited on the W pattern 15A. The gate hard mask layer 16 may include a nitride layer and functions as a barrier during etch and chemical mechanical polishing (CMP) processes simultaneously performed with a subsequent landing plug contact (LPC) process.

If the thermal treatment process is performed after depositing the gate hard mask layer 16, and not after depositing the W layer 15, it is still possible to increase the grain size of the W layer 15.

However, when performing the thermal treatment process 100 after the deposition of the gate hard mask layer 16, a thermal stress may be generated due to a densification of a nitride layer which is used as the gate hard mask layer 16. The thermal stress disturbs an effective change of the grain size of the W layer 15.

Thus, the thermal treatment process 100 for increasing the grain size of the W layer 15 can be performed before depositing the gate hard mask layer 16. Although it is not shown, a process for patterning a gate is subsequently performed.

Since the thermal stress is insignificant when other materials, e.g., an oxide layer, are used, the thermal treatment process 100 can be performed after depositing the gate hard mask layer 16 or patterning the gate. However, it is more beneficial to perform the thermal treatment process 100 before depositing the gate hard mask layer 16 in regard to the increase of the grain size of the W layer 15.

In accordance with this embodiment, after depositing the W layer, the thermal treatment process is performed on the gate structure, so that the grain size of the W layer increases, wherein the gate structure includes the silicon-containing layer doped with P-type conductive impurities, the Ti-containing diffusion barrier layer, and the W layer. As a result, it is possible to reduce the contact resistance of the gate structure as well as the sheet resistance of the W layer.

Figure 5A:
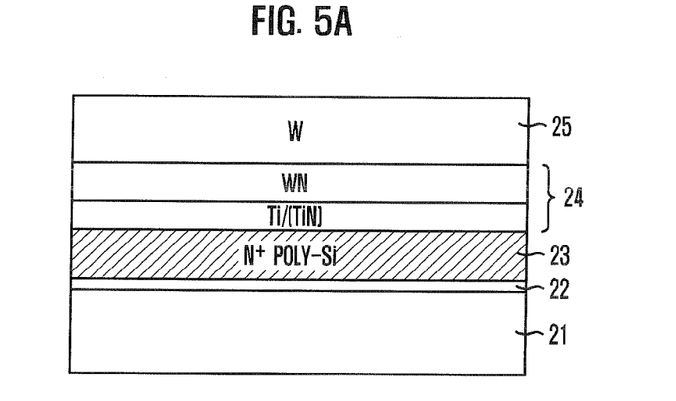
FIGS. 5A to 5C are cross-sectional views illustrating a method for fabricating a W line in accordance with a second embodiment of the present invention.
Figure 5B:
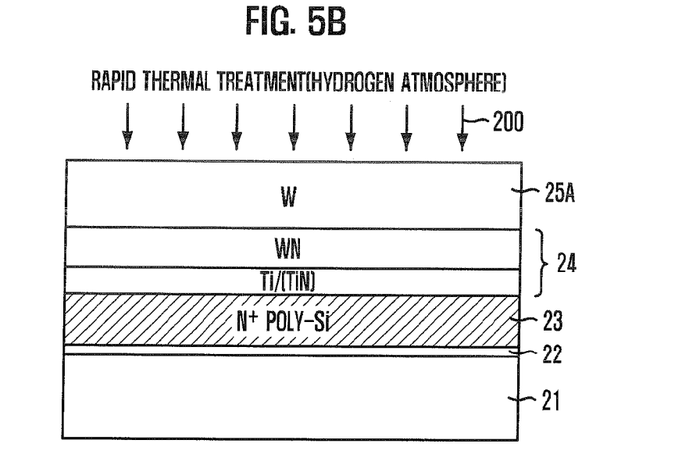
Figure 5C:
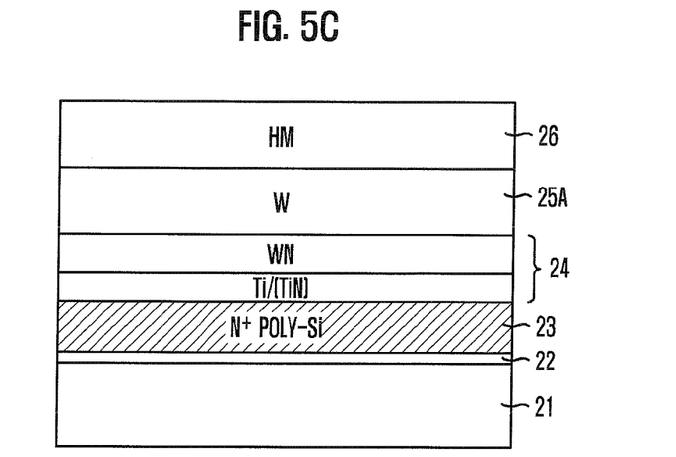

FIGS. 5A to 5C are cross-sectional views illustrating a method for fabricating a W line in accordance with a second embodiment of the present invention.

The W line has a gate structure of, for example, an NMOS transistor.

Referring to FIG. 5A, a gate insulation layer 22 is formed over a substrate 21. The gate insulation layer 22 may be a $SiO_2$ or a SiON layer.

A silicon-containing layer 23 is formed over the gate insulation layer 22. The silicon-containing layer 23 may include a polysilicon layer, for example, a polysilicon layer doped with the impurities or a polysilicon layer doped with N-type conductive impurities (i.e., an $N^+$ Poly-Si layer). The N-type conductive impurities may include arsenic (As) or phosphorus (P).

A diffusion barrier layer 24 is formed over the silicon-containing layer 23. The diffusion barrier layer 24 may include a Ti-containing material. The diffusion barrier layer 24 can be a double layer of Ti/WN, a double layer of TiN/WN, or a triple layer of Ti/TiN/WN. The Ti layer, the TiN layer, and the WN layer are deposited using a physical vapor deposition (PVD) method. Particularly, the Ti layer has a crystal-like structure since it is deposited by the PVD method. Thus, the TiN layer and the WN layer deposited on the crystalloid Ti layer also have crystal-like structures.

A W layer 25 is deposited on the diffusion barrier layer 24 using the PVD method.

In this embodiment, since the diffusion barrier layer 24 includes the crystalloid Ti layer, the WN layer deposited on the Ti layer also has a crystal-like structure. Accordingly, the grain size of the W layer 25 deposited on the WN layer becomes small.

Referring to FIG. 5B, after depositing the W layer 25, a thermal treatment process 200 is performed to increase the grain size of the W layer 25. The thermal treatment process 200 may be a rapid thermal treatment process and may be performed in a $H_2$ atmosphere.

The rapid thermal treatment has higher mass productivity than other thermal treatments and reduces an attack on the materials below the W layer 25 by performing the process in a short time. Performing the thermal treatment process in a furnace takes a longer time, so that it is difficult to prevent an attack by a thermal budget and the W layer 25 easily becomes abnormally oxidized in the furnace.

The reason for performing the process in the $H_2$ atmosphere is to prevent the abnormal oxidation of the W layer 25. When performing the thermal treatment in other atmospheres such as $NH_3$, $O_2$ or $N_2$ atmospheres, the abnormal oxidation of the W layer 25 can be caused easily.

The temperature for the thermal treatment process ranges from approximately 800° C. to approximately 1,000° C., desirably, from approximately 800° C. to approximately 950° C. The thermal treatment process is performed within five minutes. When the temperature for the thermal treatment is higher than approximately 1,000° C., the abnormal oxidation of the W layer 25 may be caused. When the temperature for the thermal treatment process is lower than approximately 800° C., the grain size of the W layer 25 does not increase effectively.

As described, the grain size of the W layer 25 can be increased by the thermal treatment process 200. Thus, the sheet resistance of the W line may be lowered compared to not performing the thermal treatment on the W layer 25. The W layer 25 having the increased grain size is called a W pattern 25A.

Referring to FIG. 5C, a gate hard mask layer 26 is deposited on the W pattern 25A. The gate hard mask layer 26 may include a nitride layer and functions as a barrier in etch and CMP processes performed with a subsequent LPC process.

If the thermal treatment process is performed after depositing the gate hard mask layer 26, and not immediately after depositing the W layer 25, the grain size of the W layer 25 may still be increased.

However, when performing the thermal treatment process 200 after depositing the gate hard mask layer 26, a thermal stress may be generated due to a densification of the nitride layer, i.e., the gate hard mask layer 26. The thermal stress disturbs an effective change of the grain size of the W layer 25.

Thus, the thermal treatment process 200 for increasing the grain size of the W layer 25 may be performed before depositing the gate hard mask layer 26. Although it is not shown, a process for patterning a gate is subsequently performed.

Since the thermal stress is insignificant when using other material layers, e.g., an oxide layer, as the gate hard mask layer 26, the thermal treatment process 200 can be performed after depositing the gate hard mask layer 26 or patterning the gate to obtain the same effect. However, it is more beneficial to perform thermal treatment process 200 before depositing the gate hard mask layer 26 in order to effectively increase the grain size of the W layer 25.

In accordance with this embodiment, after depositing the W layer, the thermal treatment process is performed on the gate structure, so that the grain size of the W layer increases, wherein the gate structure includes the silicon-containing layer doped with N-type conductive impurity, a diffusion barrier layer including the Ti, and the W layer. As a result, it is possible to reduce the contact resistance of the gate structure as well as the sheet resistance of the W layer.

FIGS. 6A to 6D are cross-sectional views of a method for fabricating a W line in accordance with a third embodiment of the present invention where the W line is applied to a dual gate structure.

The dual gate structure has an NMOS transistor gate and a PMOS transistor gate. The NMOS transistor gate includes a silicon-containing layer doped with N-type impurities and the PMOS transistor gate includes a silicon-containing layer doped with P-type impurities. The NMOS transistor gate and the PMOS transistor gate are simultaneously embodied over a substrate. Typically, in a dynamic random access memory (DRAM) device, a cell region has NMOS transistors formed therein and a peripheral region has NMOS and the PMOS transistors formed therein. This embodiment shows a method for simultaneously fabricating gates of the transistors over the substrate including the cell region and the peripheral region.

Figure 6A:
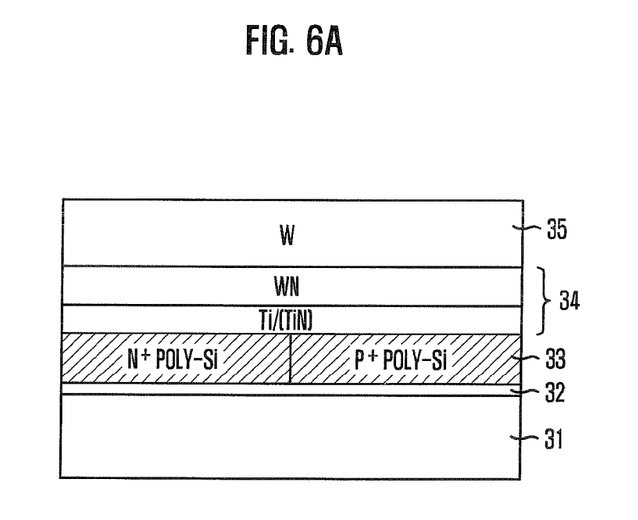
FIGS. 6A to 6D are cross-sectional views of a method for fabricating a W line in accordance with a third embodiment of the present invention where the W line is applied to a dual gate structure.

Referring to FIG. 6A, a gate insulation layer 32 is formed over a substrate 31 having first and second regions. The gate insulation layer 32 may be a $SiO_2$ or SiON layer. The first region may be a NMOS transistor region and the second region may be a PMOS transistor region.

A silicon-containing layer 33 is formed over the gate insulation layer 32. The silicon-containing layer 33 may be a polysilicon layer, for example, a polysilicon layer doped with impurities. The silicon-containing layer 33 may include a first region doped with N-type conductive impurities, i.e., $N^+$ Poly-Si region, and a second region doped with P-type conductive impurities, i.e., $P^+$ poly-Si region, each region co-existing separately. The P-type conductive impurities include B. The N-type conductive impurities include As or P. The reason for separately doping different conductive impurities is to form a dual gate structure over the substrate 31.

A diffusion barrier layer 34 is formed over the silicon-containing layer 33. The diffusion barrier layer 34 may include a Ti-containing material. For example, the diffusion barrier layer 34 can be a double layer of Ti/WN, a double layer of TiN/WN, or a triple layer of Ti/TiN/WN. The Ti layer, the TiN layer, and the WN layer are deposited using a PVD method. Particularly, the Ti layer has a crystal-like structure since it is deposited by the PVD method. Thus, the TiN layer and the WN layer deposited on the crystalloid Ti layer also have crystal-like structures.

A W layer 35 is deposited on the diffusion barrier layer 34 using the PVD method.

In this embodiment, since the diffusion barrier layer 34 includes the crystalloid Ti layer, the WN layer deposited on the Ti layer also has a crystal-like structure. Accordingly, the grain size of the W layer 35 deposited on the WN layer becomes small.

Figure 6B:
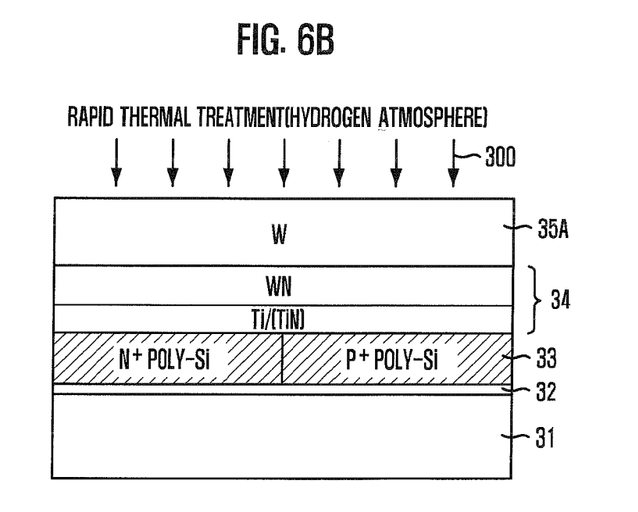

Referring to FIG. 6B, after depositing the W layer 35, a thermal treatment process 300 is performed to increase the grain size of the W layer 35. The thermal treatment process 300 may be a rapid thermal treatment process and may be performed in a $H_2$ atmosphere.

The rapid thermal treatment has higher mass productivity than other thermal treatments and reduces an attack on the materials below the W layer 35 by performing the process in a short time. If the thermal treatment process is performed in a furnace, it takes a longer time, so that it is difficult to prevent an attack by a thermal budget and the W layer 35 is easy to be abnormally oxidized in the furnace.

The reason for performing the process in a $H_2$ atmosphere is to prevent the abnormal oxidation of the W layer 35. When performing the thermal treatment in other atmospheres such as $NH_3$, $O_2$ or $N_2$ atmospheres, the abnormal oxidation of the W layer 35 can be easily caused.

The temperature for the thermal treatment process ranges from approximately 800° C. to approximately 1,000° C., desirably, from approximately 800° C. to approximately 950° C. The thermal treatment process is performed within five minutes. When the temperature for the thermal treatment is higher than approximately 1,000° C., the abnormal oxidation of the W layer 35 may be caused. When the temperature for the thermal treatment process is lower than approximately 800° C., the grain size of the W layer 35 does not increase effectively.

As described, the grain size of the W layer 35 can be increased by the thermal treatment process 300. Thus, the sheet resistance of the W line may be lowered compared to not performing the thermal treatment on the W layer 35. The W layer 35 having the increased grain size is called a W pattern 35A.

Figure 6C:
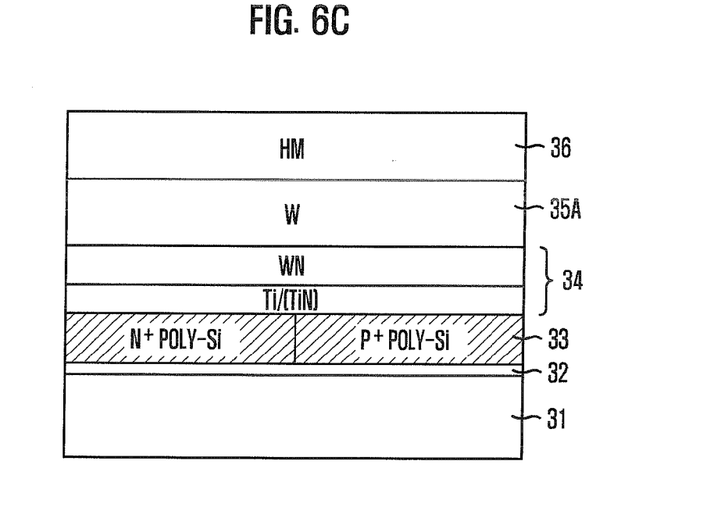

Referring to FIG. 6C, a gate hard mask layer 36 is deposited on the W pattern 35A. The gate hard mask layer 36 may include a nitride layer and functions as a barrier in etch and CMP processes performed with a subsequent LPC process.

If the thermal treatment process is performed after depositing the gate hard mask layer 36 and not after depositing the W layer 35, the grain size of the W layer 35 may still be increased.

However, when performing the thermal treatment process 300 after depositing the gate hard mask layer 36, a thermal stress may be generated due to a densification of the nitride layer, i.e., the gate hard mask layer 36. The thermal stress disturbs an effective change of the grain size of the W layer 35.

Thus, the thermal treatment process 300 for increasing the grain size of the W layer 35 may be performed before depositing the gate hard mask layer 36.

Figure 6D:
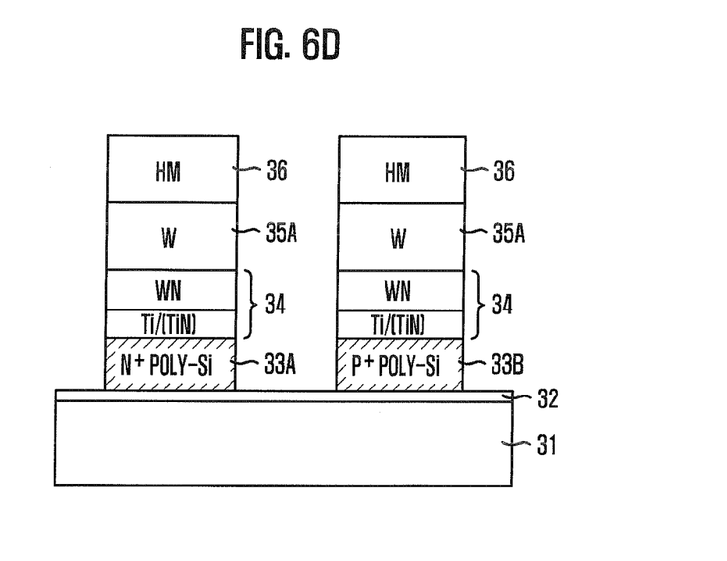

Referring to FIG. 6D, a gate patterning process is performed to simultaneously form the NMOS transistor gate and PMOS transistor gate. The NMOS transistor gate includes a silicon electrode 33A doped with the N-type impurities and the PMOS transistor gate includes a silicon electrode 33B doped with the P-type impurities. The dual gate structure includes both of the PMOS transistor gate and the NMOS transistor gate.

Since the thermal stress is insignificant when using other material layers, e.g., an oxide layer, as the gate hard mask layer 36, the thermal treatment process 300 can be performed after depositing the gate hard mask layer 36 or patterning the gate to obtain the same effect. However, it is more beneficial to perform the thermal treatment process 300 before depositing the gate hard mask layer 36 in order to effectively increase the grain size of the W layer 35.

In accordance with this embodiment, when using the W line to form the dual gate, the thermal treatment process is performed on the W layer deposited on the crystalloid diffusion barrier layer. Thus, the grain size of the W layer increases, so that the sheet resistance of each gate of the gate structure can be reduced. Furthermore, by using the Ti-containing diffusion barrier layer, it is possible to reduce the contact resistance of each of the gates.

FIGS. 7A to 7D are cross-sectional views of a method for fabricating a W line in accordance with a fourth embodiment of the present invention.

Figure 7A:
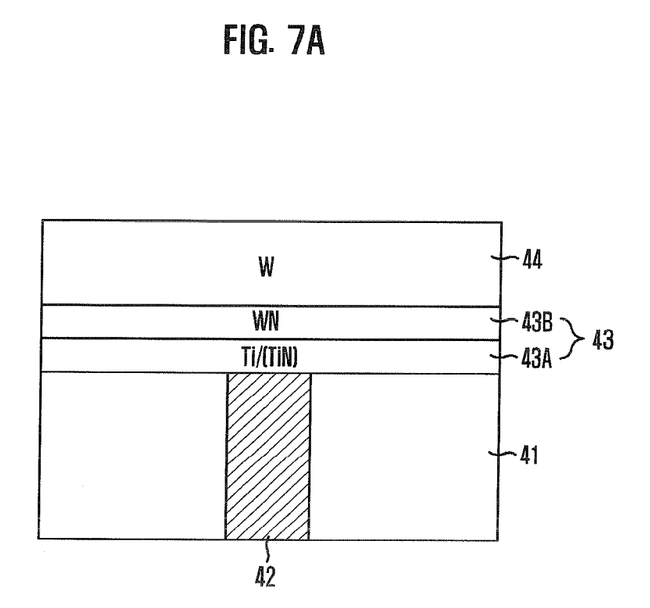
FIGS. 7A to 7D are cross-sectional views of a method for fabricating a W line in accordance with a fourth embodiment of the present invention.

Referring to FIG. 7A, a diffusion barrier layer 43 is formed over a lower layer 41 including a bit line contact 42. The lower layer 41 may be an insulation layer (e.g., an oxide layer). The bit line contact 42 may include a silicon-containing material (e.g., polysilicon). Thus, the bit line contact 42 may be a polysilicon plug.

The diffusion barrier layer 43 may include a Ti-containing material. For example, the diffusion barrier layer 43 can be a double layer of Ti/WN, a double layer of TiN/WN; or a triple layer of Ti/TiN/WN. The Ti layer, the TiN layer, and the WN layer are deposited using a PVD method. Particularly, the Ti layer has a crystal-like structure since it is deposited by the PVD method. Thus, the TiN layer and the WN layer deposited on the crystalloid Ti layer also have crystalloid.

A W layer 44 is deposited on the diffusion barrier layer 43 using the PVD method.

In this embodiment, since the diffusion barrier layer 43 includes the crystalloid Ti layer, the WN layer deposited on the Ti layer also has a crystal-like structure. Accordingly, the grain size of the W layer 44 deposited on the WN layer becomes small.

Figure 7B:
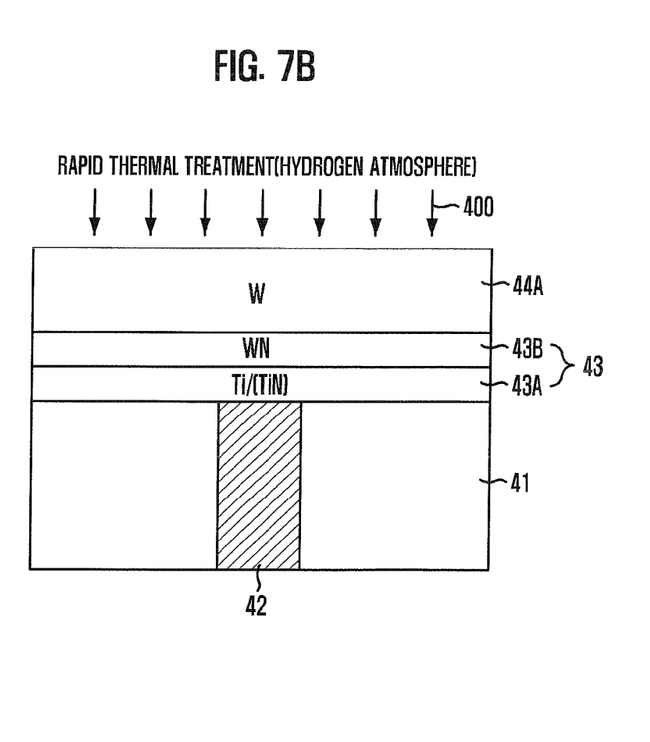

Referring to FIG. 7B, after depositing the W layer 44, a thermal treatment process 400 is performed to increase the grain size of the W layer 44. The thermal treatment process 400 may be a rapid thermal treatment process and may be performed in the $H_2$ atmosphere.

The rapid thermal treatment has higher mass productivity than other thermal treatments and reduces an attack on the materials below the W layer 44 by performing the process in a short time. If the thermal treatment is performed in a furnace, it takes a longer time, so that it is difficult to prevent an attack by a thermal budget and the W layer 44 is easy to be abnormally oxidized.

The reason for performing the process in the $H_2$ atmosphere is to prevent the abnormal oxidation of the W layer 44. When performing the thermal treatment in other atmospheres such as $NH_3$, $O_2$ or $N_2$ atmospheres, the abnormal oxidation of the W layer 44 can be easily caused.

The temperature for the thermal treatment process ranges from approximately 800° C. to approximately 1,000° C., desirably, from approximately 800° C. to approximately 950° C. The thermal treatment process is performed within five minutes. When the temperature for the thermal treatment is higher than approximately 1,000° C., the abnormal oxidation of the W layer 44 may be caused. When the temperature for the thermal treatment process is lower than approximately 800° C., the grain size of the W layer 44 does not increase effectively.

As described, the grain size of the W layer 44 can be increased by the thermal treatment process 400. Thus, the sheet resistance of the W line may be lowered compared to not performing the thermal treatment on the W layer 44. The W layer 44 having the increased grain size is called a W pattern 44A.

Figure 7C:
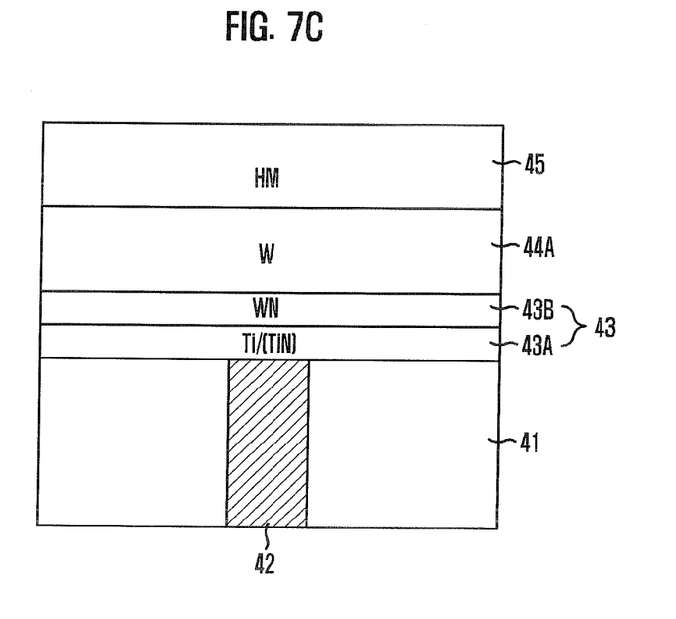

Referring to FIG. 7C, a bit line hard mask layer 45 is deposited on the W pattern 44A. The bit line hard mask layer 45 may include a nitride layer and functions as a barrier in etch and CMP processes performed with a subsequent storage node contact plug (SNC) process. Furthermore, the bit line hard mask layer 45 functions as an insulation layer for the bit line and conductive layers around the bit line.

On the other hand, if the thermal treatment process 400 is performed after depositing the bit line hard mask layer 45, and not after depositing the W layer 44, the grain size of the W layer 44 may still be increased.

However, when performing the thermal treatment process 400 after depositing the bit line hard mask layer 45, a thermal stress may be generated due to a densification of the nitride layer. The thermal stress disturbs an effective change of the grain size of the W layer 44.

Thus, the thermal treatment process 400 for increasing the grain size of the W layer 44 may be performed before depositing the bit line hard mask layer 45.

Figure 7D:
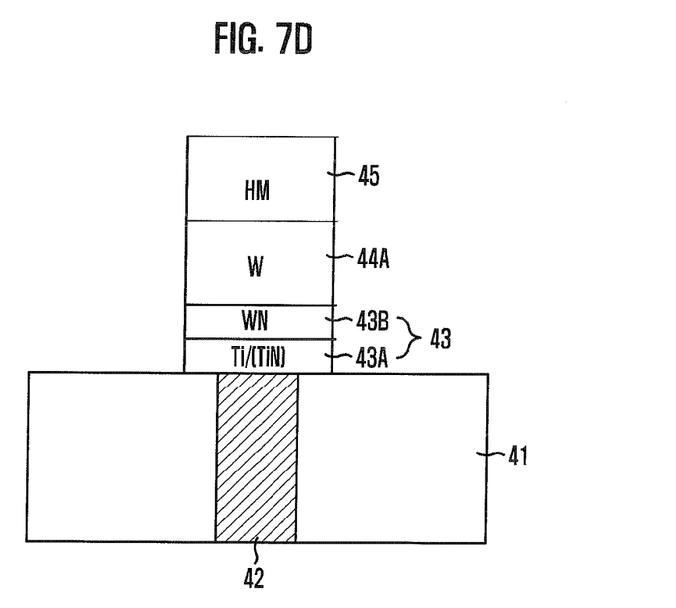

Referring to FIG. 7D, a bit line patterning process for sequentially etching the bit line hard mask layer 45, the W layer 44, and the diffusion barrier layer 43 may be performed.

Since the thermal stress is insignificant when using other material layers, e.g., an oxide layer, as the bit line hard mask layer 45, the thermal treatment process 400 can be performed after depositing the bit line hard mask layer 45 or patterning the bit line. However, it is more beneficial to perform the thermal treatment process 400 before depositing the bit line hard mask layer 45 in order to effectively increase the grain size of the W layer 44.

Figure 8A:
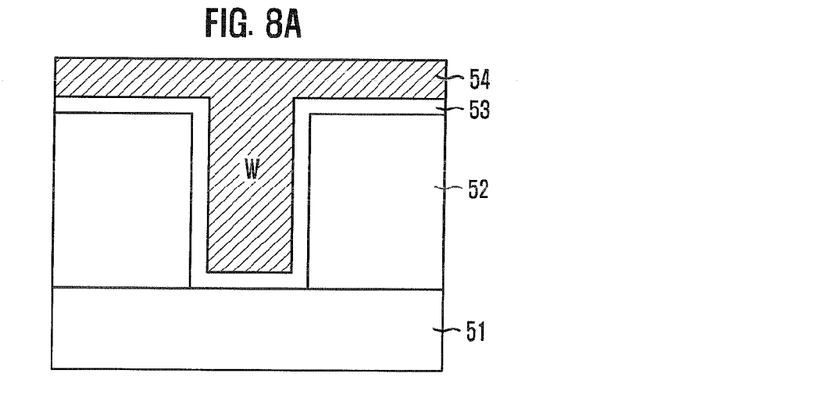
FIGS. 8A to 8C are cross-sectional view of a method for fabricating a W line in accordance with a fifth embodiment of the present invention where the W line is applied to a contact structure.
Figure 8B:
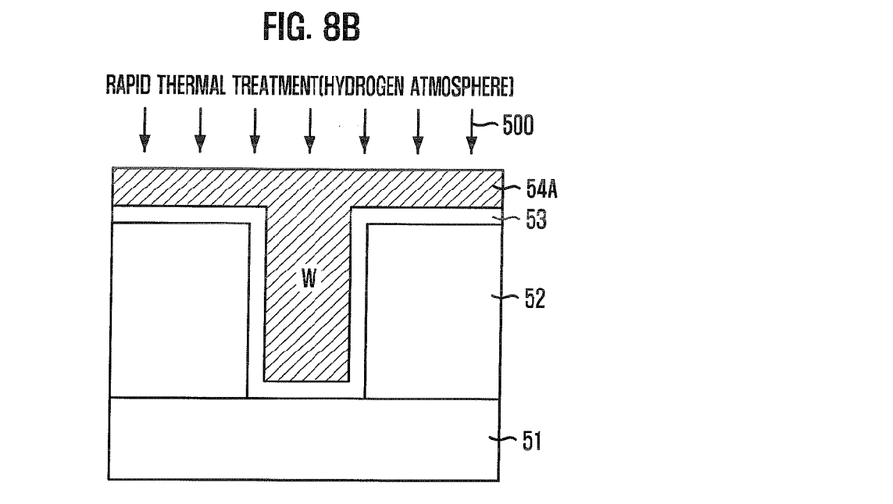
Figure 8C:
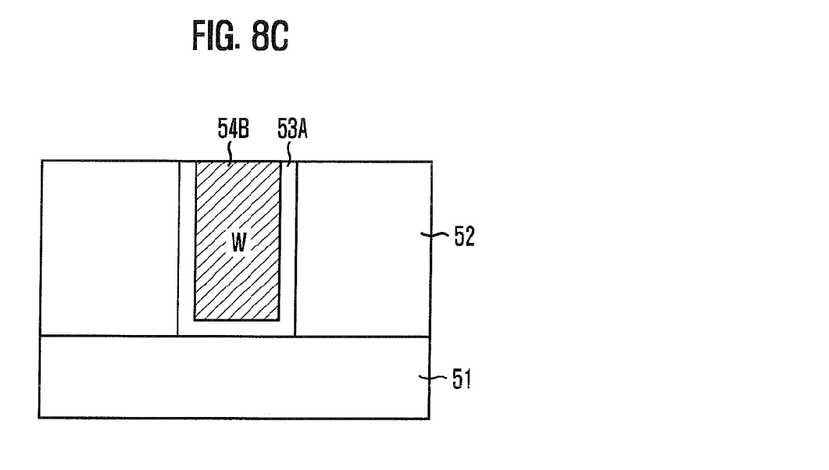

FIGS. 8A to 8C are cross-sectional view of a method for fabricating a W line in accordance with a fifth embodiment of the present invention where the W line is applied to a contact structure.

Referring to FIG. 8A, an insulation layer 52, e.g., an interlayer insulation layer, is formed over a substrate 51. The insulation layer 52 may be a $SiO_2$ layer. The substrate 51 may include a silicon-containing material. The substrate 51 may be a source/drain region of a transistor doped with impurities or a plug doped with the impurities. The impurities may be P-type conductive impurities and or N-type conductive impurities. The P-type conductive impurities include B. The N-type conductive impurities include As or P.

A contact hole exposing the substrate 51 is formed by etching the insulation layer 52. Then, a diffusion barrier layer 53 is formed over a whole surface of the resultant structure. The diffusion barrier layer 53 includes a Ti-containing material. The diffusion barrier layer 53 may be a double layer of Ti/WN, a double layer of TiN/WN, or a triple layer of Ti/TiN/WN. The Ti layer, the TiN layer, and the WN layer are deposited using a PVD method. Particularly, the Ti layer is deposited using the PVD method to have a crystal-like structure. Thus, the TiN layer and the WN layer deposited on the crystalloid Ti layer have a crystal-like structure. A W layer 54 is also deposited on the diffusion barrier layer 53 to bury the contact hole. The W layer 54 is deposited using the PVD method.

In this embodiment, since the diffusion barrier layer 53 includes the crystalloid Ti layer, the WN layer deposited on the Ti layer also has a crystal-like structure. Accordingly, the grain size of the W layer 54 deposited on the WN layer becomes small.

Referring to FIG. 8B, after depositing the W layer, a thermal treatment process 500 is performed to increase the grain size of the W layer 54. The thermal treatment process 500 may be a rapid thermal treatment process and may be performed in a $H_2$ atmosphere.

The rapid thermal treatment has higher mass productivity than other thermal treatments and reduces an attack on the materials below the W layer 54 by performing the process in a short time. If the thermal treatment is performed in a furnace, it takes a longer time, so that it is difficult to prevent an attack by a thermal budget and the W layer 54 is easy to be abnormally oxidized in the furnace.

The reason for performing the process in the $H_2$ atmosphere is to prevent the abnormal oxidation of the W layer 54. When performing the thermal treatment in other atmospheres such as $NH_3$, $O_2$ or $N_2$ atmospheres, the abnormal oxidation of the W layer 54 can be easily caused.

The temperature for the thermal treatment process ranges from approximately 800° C. to approximately 1,000° C., desirably, from approximately 800° C. to approximately 950° C. The thermal treatment process is performed within five minutes. When the temperature for the thermal treatment is higher than approximately 1,000° C., the abnormal oxidation of the W layer 54 may be caused. When the temperature for the thermal treatment process is lower than approximately 800° C., the grain size of the W layer 54 does not increase effectively.

As described, the grain size of the W layer 54 can be increased by the thermal treatment process 500. Thus, the sheet resistance of the W line may be lowered compared to not performing the thermal treatment on the W layer 54. The W layer 54 having the increased grain size is called a W pattern 54A.

Referring to FIG. 8C, the W pattern 54A and the diffusion barrier layer 53 are selectively etched to leave the W pattern 54B and the diffusion barrier layer 53A only in the contact hole.

The same effect is obtained even if the thermal treatment process 500 is performed after the selective etching of the W 54A and the diffusion barrier layer 53. However, in order to effectively increase the grain size of the W layer, the thermal treatment process 500 may be performed after depositing the W layer 54.

In accordance with the fourth and the fifth embodiments, the thermal treatment process is performed on the W layer as soon as the W layer is formed on the crystalloid diffusion barrier layer when the W line is applied to the bit line structure or the contact structure. Thus, the sheet resistance of the W layer in the bit line structure or the contact structure decreases as the grain size of the W layer increases. When applying the Ti-containing diffusion barrier layer, the contact resistance of the bit line structure or the contact structure is also reduced.

Figure 9:
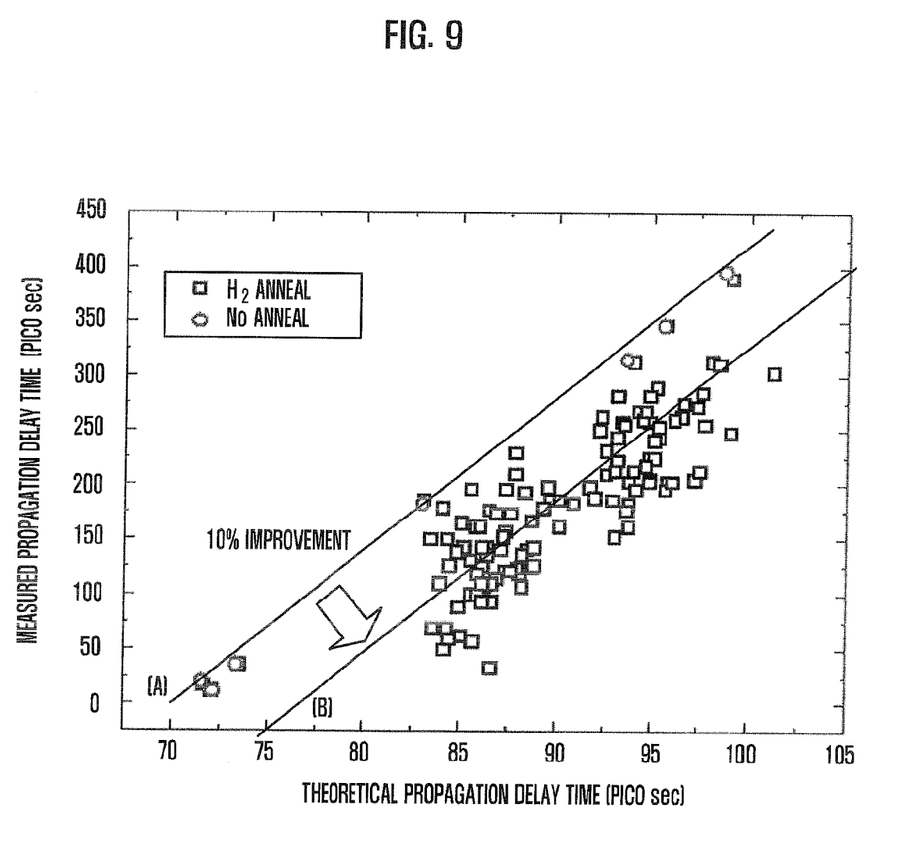
FIG. 9 is a graph showing a propagation delay time decreasing as a sheet resistance decreases when applying a W line in accordance with a third embodiment to a gate structure of a transistor.

FIG. 9 is a graph showing a propagation delay time decreasing as a sheet resistance decreases when applying a W line in accordance with a third embodiment to a gate structure of a transistor. For instance, the W line including the thermal treated W layer is employed to the gate structure in the transistor and a propagation delay time is measured by using a ring oscillator including 101 inverters made of the transistor.

Referring to FIG. 9, the propagation delay time of a case of employing the thermal treatment (B) is reduced as much as about 10% compared to a case without the thermal treatment (A).

That is, the additional thermal treatment process increases the grain size of the W layer in order to decrease the sheet resistance effectively. Thus, it is possible to acquire a high speed device operation.

The effect of decreasing the propagation delay time may be also acquired by the other embodiments not only the third embodiment.

The above embodiments explain the gate structure, the bit line structure, the contact structure including the crystalloid diffusion barrier layer and the W layer. However, this invention can be applied to a process for fabricating a metal line including the crystalloid diffusion barrier and the W layer. Therefore, this invention can be applied to a metal line in a flash memory device.

When embodying the same sheet resistance in the above embodiments, the thermal treatment process is performed after depositing the W layer and thus, the grain size of the W layer increases. As a result, it is possible to reduce a thickness of the W layer, resulting in an increase in the degree of integration.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a tungsten (W) line, the method consisting of:
    forming a silicon-containing layer over a substrate;
    forming a diffusion barrier layer over the silicon-containing layer;
    forming a tungsten layer over the diffusion barrier layer;
    performing a thermal treatment process on the substrate including the tungsten layer to increase a grain size of the tungsten layer; and
    forming a hard mask layer over the tungsten layer having the increased grain size,
    wherein the thermal treatment process is performed before the hard mask layer is formed over the tungsten layer, and the thermal treatment process is performed in a hydrogen ($H_2$) atmosphere.

2. The method as recited in claim 1, wherein the thermal treatment process is a rapid thermal treatment process (RTP).

3. The method as recited in claim 2, wherein the thermal treatment process is performed at a temperature of approximately 800° C. to approximately 1,000° C.

4. The method as recited in claim 1, wherein the tungsten layer is formed using a physical vapor deposition (PVD) method.

5. The method as recited in claim 1, wherein the diffusion barrier layer has a crystal-like structure.

6. The method as recited in claim 5, wherein the diffusion barrier layer has a crystalline structure.

7. The method as recited in claim 1, wherein the diffusion barrier layer has a stack structure of a titanium (Ti) layer and a tungsten nitride (WN) layer.

8. The method as recited in claim 1, wherein the diffusion barrier layer is a stack structure of TiN/WN or a stack structure of Ti/TiN/WN.

9. The method as recited in claim 1, wherein the diffusion barrier layer includes a stack structure of a first layer including titanium and a second layer including tungsten, and the diffusion barrier layer has a crystal-like structure.

10. The method as recited in claim 1, wherein the silicon-containing layer includes a polysilicon layer.

11. The method as recited in claim 10, wherein the polysilicon layer includes impurities.

12. The method as recited in claim 11, wherein the impurities include boron (B), arsenic (As), phosphorus (P), or a combination thereof.

13. The method as recited in claim 1, wherein a stack structure of the silicon-containing layer, the diffusion barrier layer and the thermal treated tungsten layer defines a gate, a bit line, or a metal line.

14. The method as recited in claim 1, wherein the hard mask layer includes a nitride layer.

15. A method for fabricating a gate of a semiconductor gate, the method consisting of:
   forming a gate insulation layer over a substrate;
   forming a silicon-containing layer over the gate insulation layer;
   forming a diffusion barrier layer over the silicon-containing layer, the diffusion barrier layer having a crystal-like structure;
   forming a tungsten layer over the diffusion barrier layer, the tungsten layer having a crystal-like structure and a first average grain size;
   performing a thermal treatment process on the substrate including the tungsten layer, the tungsten layer having a second average grain size after the thermal treatment, the second average grain size being larger than the first average grain size; and
   forming a gate hard mask layer over the tungsten layer having the second average grain size,
   wherein the thermal treatment process is performed before the gate hard mask layer is formed over the tungsten layer, and the thermal treatment process is performed only in a hydrogen ($H_2$) atmosphere.

16. The method as recited in claim 15, wherein the thermal treatment process is a rapid thermal treatment process (RTP).

17. The method as recited in claim 16, wherein the thermal treatment process is performed at a temperature of approximately 800° C. to approximately 1,000° C.

18. The method as recited in claim 15, wherein the tungsten layer is formed using a physical vapor deposition (PVD) method.

19. The method as recited in claim 15, wherein the diffusion barrier layer has a stack structure of a TiN layer and a WN layer, wherein each of the TiN layer and the WN layer has a crystalline structure.

20. The method as recited in claim 15, wherein the diffusion barrier layer includes a stack structure of TiN/WN layers or a stack structure of Ti/TiN/WN layers.

21. The method as recited in claim 15, wherein the diffusion barrier layer is formed using a PVD method.

22. The method as recited in claim 15, wherein the silicon-containing layer includes a polysilicon layer.

23. The method as recited in claim 22, wherein the polysilicon layer includes impurities, the impurities including boron (B), arsenic (As), or phosphorus (P), or a combination thereof.

24. The method as recited in claim 15, wherein the silicon-containing layer is a polysilicon layer including a first region having P-type impurities and a second region having N-type impurities.

* * * * *